United States Patent [19]

Kelly

[11] Patent Number: 4,706,063
[45] Date of Patent: Nov. 10, 1987

[54] PRESSURE-BIASED, TEMPERATURE SENSOR

[75] Inventor: Robert R. Kelly, Hoffman Estates, Ill.

[73] Assignee: Borg-Warner Corporation, Chicago, Ill.

[21] Appl. No.: 857,864

[22] Filed: May 1, 1986

[51] Int. Cl.⁴ .............................................. B60Q 1/00
[52] U.S. Cl. ...................................... 340/60; 340/611;
200/83 C; 200/83 D; 73/729; 374/145
[58] Field of Search ................. 340/60, 592, 611, 521;
200/83 R, 83 A, 83 B, 83 C, 83 D; 73/729;
374/145

[56]  References Cited

U.S. PATENT DOCUMENTS

| 1,815,642 | 7/1931 | Zubaty | 236/34 |
| 1,933,453 | 10/1933 | Schlaich | 177/351 |
| 3,338,099 | 8/1967 | Remick, Jr. et al. | 73/345 |
| 3,439,356 | 4/1969 | Kinzer | 340/236 |
| 4,051,728 | 10/1977 | Metz | 73/343 R |
| 4,652,854 | 3/1987 | Kelly | 340/60 |
| 4,663,608 | 5/1987 | Kelly | 340/60 |

OTHER PUBLICATIONS

U.S. patent application Ser. Nos. 728,735, 728,736—filed 4-30-85, "A Pressure-Biased Temperature Sensor"—Kelly, R. R.

Primary Examiner—James L. Rowland
Assistant Examiner—Jeffery A. Hofsass
Attorney, Agent, or Firm—Florian S. Gregorczyk

[57] ABSTRACT

A pressure-biased, temperature sensor means utilizing a cooperating pair of aligned bellows operators in a chamber communicating with a fluid to a reference pressure. One of the bellows is responsive to an elevated temperature of a fluid coolant system and the second bellows, which communicates with the fluid coolant system, is responsive to a decrease in fluid pressure. The aligned bellows cooperate to move a switch actuation means to close a switch thereby completing a signal circuit and energizing a signal means.

5 Claims, 4 Drawing Figures

PRESSURE-BIASED, TEMPERATURE SENSOR

BACKGROUND OF THE INVENTION

1. Field of the Invention

This invention discloses a multiple function sensing means for a fluid system. More specifically, this invention relates to a sensor for a vehicular coolant system. The sensor is a relatively compact structure to monitor under-pressure and over-temperature conditions in a coolant system, and provides a signal means indicative of a malfunction. In a fluid system, coolant can boil away at normal operating temperatures if the system is open, such as with a ruptured hose or a loose radiator cap.

2. Prior Art

Monitoring devices and sensors for fluid systems are known in the art, particularly temperature sensing apparatus for automobile coolant systems. There have been efforts to provide both over-pressure and over-temperature sensing devices but not an under-pressure and over-temperature sensor. Indicative of this prior art is U.S. Pat. No. 3,439,356 (Kinzer) which discloses a pressure-temperature sensor. In this apparatus, opposed bellows chambers are coupled by a movable electrically conducting disc which is displaced between a tube end and a thermocouple function. The disc is moved to contact the thermocouple switch and energize a signal means, and thereafter the disc is adjusted with a fluid at a known pressure to disclose an accurate pressure reading. The thermocouple is utilized in a known fashion to yield the temperature of a surrounding fluid.

U.S. Pat. No. 1,933,453 (Schlaich) teaches an indicating device responsive to both temperature and pressure. However, this device requires a coil resistor 13, a temperature coil shown as bimetal coil 16, and a diaphragm operator 24. The diaphragm operator 24 is responsive to an excess pressure to open a circuit. This device provides a current from a battery (not shown) to the end of resistor coil 13 and wiper 14 which is operable by diaphragm 24. The temperature actuation, although reasonably accurate at most temperatures, is inadequate to move the indicator for its entire distance or stroke. However, at an overheated condition sufficient for the liquid to boil vigorously, an excess pressure is present that will actuate the diaphragm to move the indicator for substantially its entire travel range. A drawback noted in this device is, that until vigorous boiling occurs, the thermometer or temperature indicator does not accurately indicate the water temperature due to the difference between the water temperature and air temperature of the space surrounding the temperature responsive instrument.

U.S. Pat. No. 3,338,099 (Remick, Jr., et al) teaches a boiling point indicator which utilizes two sensors, one for pressure and one for temperature. A diaphragm operator moves a mechanical indicator. There is no teaching of an electrical signal provided for such readings, and this particular device is operable only as an indicator of a safe-unsafe temperature.

U.S. Pat. No. 4,051,728 (Metz) teaches an instrument for monitoring a physical parameter, either temperature or pressure, utilizing an elastic sensor displaceable as a function of the monitored physical parameter. However, it is capable of only monitoring one parameter at a time. The device requires a belt having characteristics which change along the length thereof. The elastic sensor is responsive to the belt characteristic to produce an output signal which varies as a function of the physical parameter being monitored. Such a device is impractical for most automotive or vehicular usages.

Illustrative of early efforts at monitoring fluid bath temperatures is U.S. Pat. No. 1,815,642 (Zubaty) illustrating a bellows filled with a heat responsive fluid, which bellows is immersed in a fluid bath. A mechanical arm is connected between the bellows and a temperature indicator. As the fluid within the bellows is heated, the bellows is permitted to expand to move the mechanical arm indicating the temperature. There is no teaching or consideration of pressure measurement.

Most vehicle coolant systems are operated at an elevated pressure which permits them to operate at a higher temperature. Generally these coolant systems are provided with relief valves to protect against an over-pressure condition. The converse of higher pressure-higher temperature operation is lower pressure-lower temperature operation, that is, at a lower pressure the coolant will boil and evaporate from the system at a lower temperature. Therefore, it is vital to be forewarned of an under-pressure condition as well as an over-temperature condition in these coolant systems.

The above devices, which require immersion in or communication with a fluid to sense either over-temperature or over-pressure, do not provide a means for measuring both an over-temperature condition and an under-pressure condition. The under-pressure condition exists when the system fluid pressure is lost from a cooling system, such as through a loose radiator cap.

SUMMARY OF THE INVENTION

A pressure-biased, temperature sensor constructed in accordance with the invention includes a housing having a chamber, a vent port and a fluid port. A first bellows filled with a heat responsive fluid and second bellows with a passage are positioned in the housing chamber in an aligned relationship with a switch actuator means therebetween so that the second bellows passage communicates with the fluid system and the first bellows contacts the housing. The housing fluid port communicates between the second bellows cavity and a fluid system. A signal means circuit is provided with a switch operable by the switch actuator for closing the circuit and energizing the signal means. Expansion of the first bellows at an elevated fluid temperature, or contraction of the second bellows by a reduction in fluid pressure moves the switch actuator to close the switch and thus the signal circuit.

BRIEF DESCRIPTION OF THE DRAWING

In the Figures of the drawing, like reference numerals identify like components, and in the drawing.

DETAILED DESCRIPTION OF THE INVENTION

Figure 1:
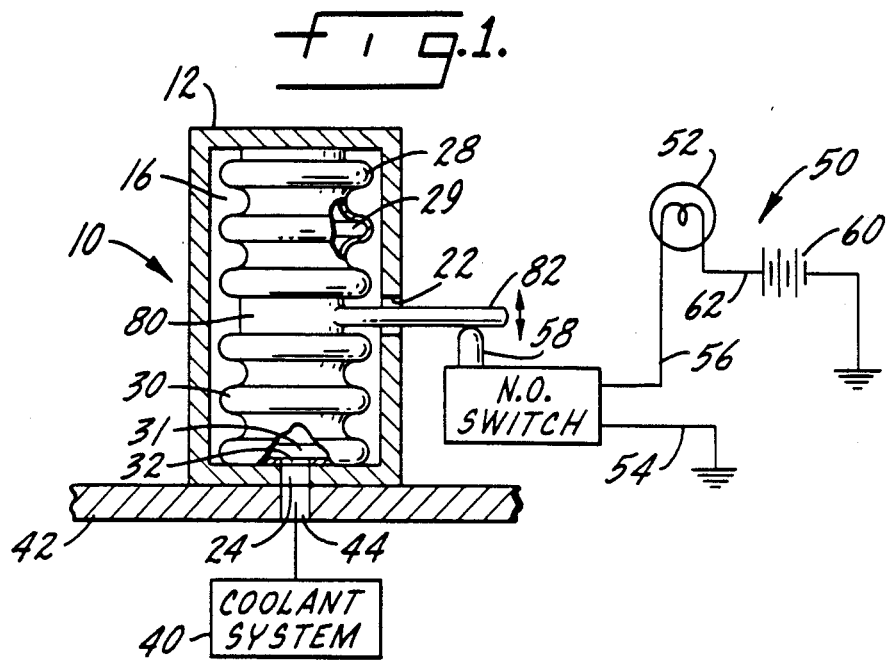
FIG. 1 is a cross-section of a schematic illustration of the pressure-biased, temperature sensor.

FIG. 1 illustrates a pressure-biased, temperature sensor 10 in a reference position with a housing 12 defining a sealed chamber 16, a vent or first port 22 and a fluid or second port 24. A first expandable bellows operator (FEO) 28 defines a volume 29, which is sealed and contains a temperature responsive fluid, and a second expandable bellows operator (SEO) 30 are positioned in a series aligned manner in chamber 16 with a switch actuator means 80 mounted between FEO 28 and SEO 30. Actuator 80 defines a protuberance or portion 82 extending through vent port 22 to contact a switch means 58 of a signal circuit 50. SEO 30 defines a cavity 31 and a passage 32 communicating with a fluid coolant system 40 through fluid port 24.

Signal circuit 50 includes a signal means 52 such as a warning lamp, a first conductor 54, a second conductor 56 and switch means 58, which is operable by actuator 80. First conductor 54 connects a first terminal of switch 58 and ground. Second conductor 56 connects between an opposite terminal of switch 58 and signal means 52, which is connected by a conductor means 62 to a source of energy 60 that is grounded. Switch 58 is illustrated as a normally-open switch operable by actuator 80 to close circuit 50.

A mounting plate 42 for fluid system 40 is shown in FIG. 1 and defines a mounting plate port 44, however, such mounting plate 42 is only provided for illustrative purposes, not as a limitation. Fluid port 24 communicates with cavity 31 through passage 32 to provide fluid from coolant system 40. A source of fluid at a reference pressure, illustrated as air at atmospheric pressure and ambient temperature, communicates with chamber 16 through vent or first port 22. As the temperature of the fluid in the fluid system 40 increases, the fluid pressure also increases in cavity 31. Pressurized fluid in cavity 31 expands SEO 30 against FEO 28 and switch actuation means 80 does not move to close switch 58. Conversely, sensor 10 senses an under-pressure condition in fluid system 40. Low pressure in cavity 31 contracts SEO 30, allows FEO 28 to expand as the temperature increases, and moves switch actuator 80 to close switch 58 and circuit 50.

An over-pressure condition in a fluid system is normally accommodated by a pressure relief valve. In the case of an automobile coolant system, relief is generally provided through the radiator cap. However, an over-temperature condition in the fluid system is detectable by FEO 28. As the ambient temperature increases, the temperature-responsive fluid in volume 29 vaporizes, FEO 28 expands against SEO 30, moving actuator 80 and protuberance 82 to close switch 58 and circuit 50.

Figure 2:
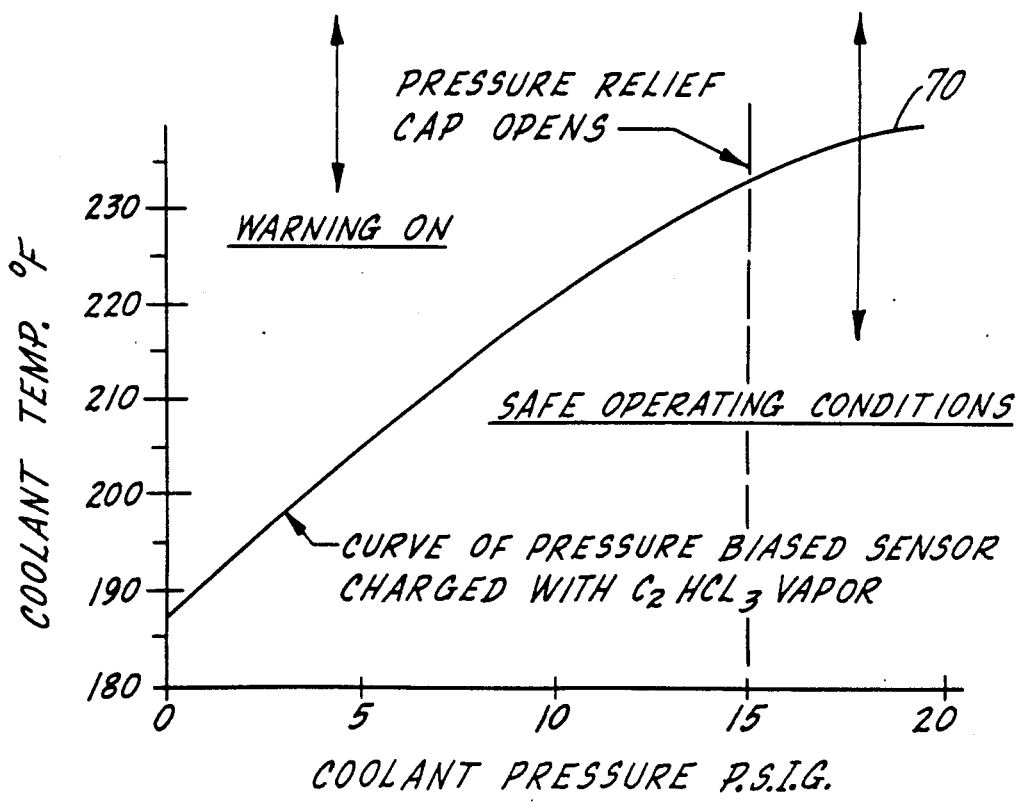
FIG. 2 is a graphical illustration of an operating curve for a pressure-biased, temperature sensor.
Figure 3:
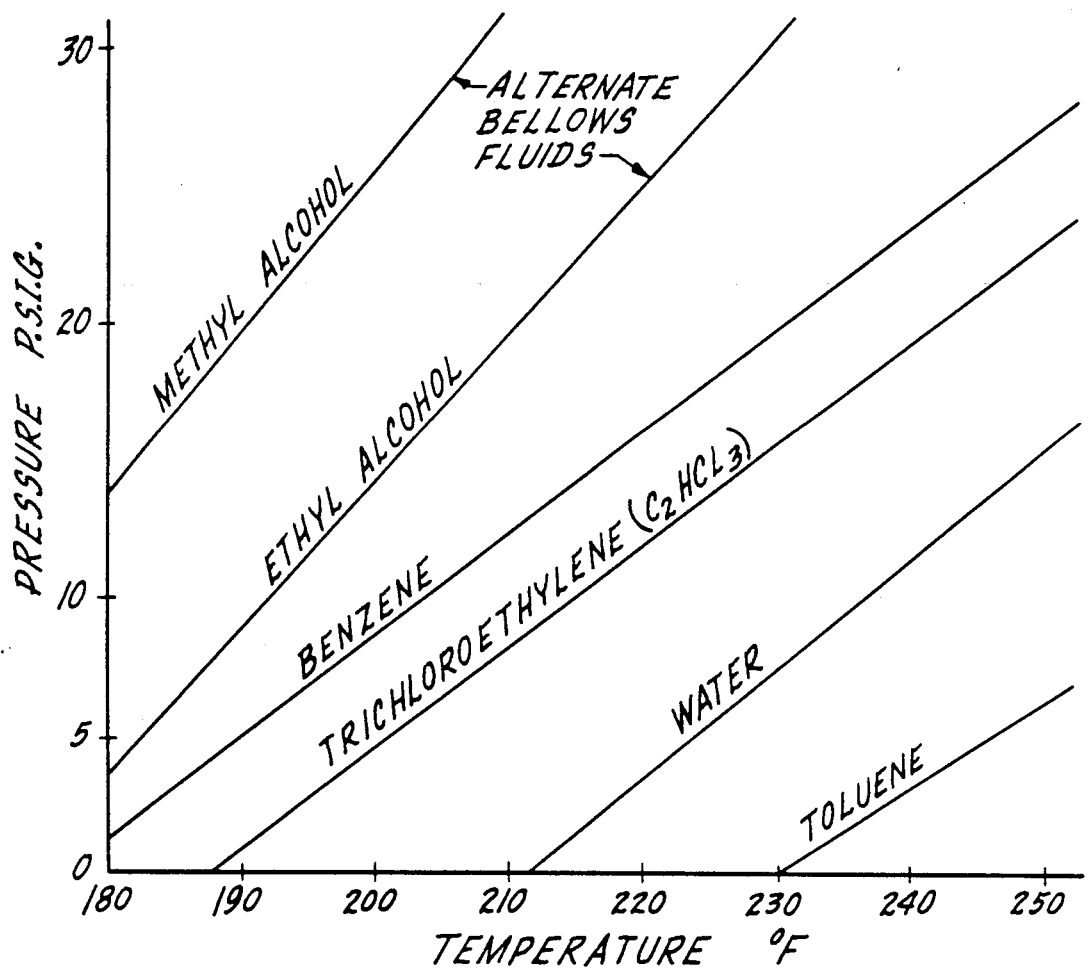
FIG. 3 illustrates a family of vapor pressure-temperature curves for various fluids utilized in sensors.

In the reference position of FIG. 1, FEO 28 and SEO 30 are at equilibrium. As the temperature of the fluid in fluid system 40 increases, the pressure of the fluid in cavity 31 of SEO 30 increases. In addition, the temperature of the reference fluid increases either by conduction or radiation, as does the pressure of the vapor in FEO 28. FIGS. 2 and 3 illustrate changes in the FEO vapor temperature and pressure. In FIG. 2, a curve 70 illustrates the change of pressure as a function of temperature for a given vapor fluid and notes an area below the curve termed the "safe operating condition". Below the curve, FEO 28 and SEO 30 remain contracted to maintain the open circuit of FIG. 1. However, above the curve, in the area noted as "warning on", the FEO vapor expands in bellows 28 and, as long as the coolant remains in the system, bellows 30 does not expand to overcome the FEO vapor pressure. FIG. 3 illustrates the pressure-temperature relationship for alternative fluids usable in chamber 29 of FEO 28.

In operation, fluid communicates from fluid means 40 through fluid port 24 to cavity 31. As the temperature of the fluid in fluid system 40 increases, the pressure of such fluid also increases. However, the present sensor provides a means for sensing an under-pressure as well as an over temperature condition. The over-temperature condition is sensed by first expandable bellows operator 28. As the temperature of the reference fluid in chamber 16 increases, the fluid within FEO 28 likewise increases and vaporizes. As the temperature of the surrounding fluid continues to increase, the vapor in FEO 28 expands and moves FEO 28 against switch actuator 80 and SEO 30 to close switch 58 and circuit 50. Closing circuit 50 energizes signal means 52, which may be a warning lamp.

A reference pressure is communicated to chamber 16 through vent port 22. In FIG. 1 this reference pressure is atmosphere although any pressure may be selected as such a reference pressure. The liquid coolant in cavity 31 expands SEO 30 against the reference pressure, as the temperature of the fluid in system 40 increases.

As the temperature of the fluid increases, the expandable fluid within FEO 28 increases in temperature. However, should the fluid escape from fluid system 40 no fluid pressure would be communicated to cavity 31, although the temperature of the environment would continue to increase. The temperature increase is not rapidly communicated to chamber 16, but an elevated temperature with no associated liquid pressure opposing expansion of FEO 28 would exist in chamber 16. Thus FEO 28 expands against SEO 30 and switch actuator 80 to close switch 58 and complete signal circuit 50 thereby energizing signal means 52. This latter condition is known as an under-pressure condition. That is, the spring force of FEO 28 is greater than the vapor pressure in cavity 31 which allows FEO 28 to expand against SEO 30 and actuator 80.

Figure 4:
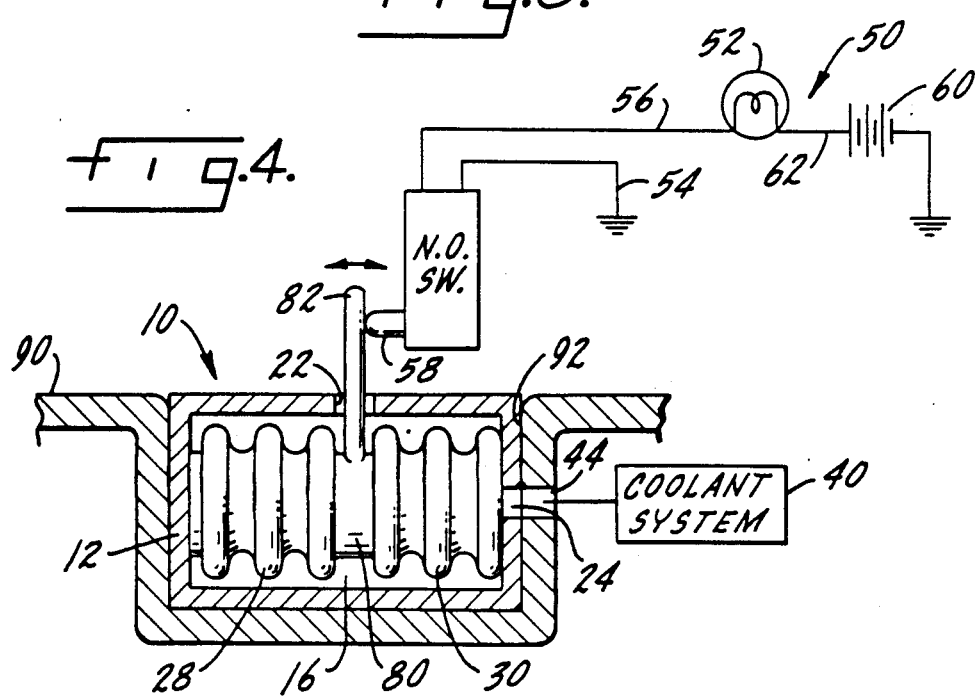
FIG. 4 illustrates a longitudinal arrangement of the embodiment of FIG. 1 in proximity to a fluid coolant system.

FIG. 4 illustrates a sensor 10 in a horizontal arrangement for a coolant system 40. As an example of a coolant system 40, an engine block 90 defines a well 92 to receive sensor 10. Second port 24 again communicates with coolant system 40 through a plate port 44. However, sensor 10 is in proximity to the source of heat (engine block), and, therefore, chamber 16 is heat soaked at the operating temperature for greater accuracy and more rapid response to temperature changes.

Those skilled in the art will recognize that certain variations can be made in the illustrated embodiments. While only specific embodiments of the invention have been described and shown, it is apparent that various alterations and modifications can be made therein. It is, therefore, the intention in the appended claims to cover all such modifications and alterations as may fall within the true scope and spirit of the invention.

I claim:

1. A pressure-biased, temperature sensor for a fluid system comprising:

a housing defining a chamber, a first port and a second port, a first expandable bellows operator within said housing defining a sealed volume;

a temperature-responsive fluid substantially filling the sealed volume;

a second expandable bellows operator in serial alignment with said first expandable bellows operator within said housing, said second expandable bellows operator defining a fluid passage and a cavity, which cavity communicates with said fluid system through said second port;

means, communicating with said chamber, for providing fluid at a reference pressure;

a signal circuit having signal means, switch means and means for receiving electrical energy, which signal circuit is completed by said switch means to energize said signal means; and a switch actuation means mounted between and operable by said first expandable bellows operator and said second expandable bellows operator, which actuation means contacts said switch means, said actuation means having a portion extending through said first port to contact said switch means;

said first expandable bellows operator and second expandable bellows operator being operable to move said switch actuation means to close said switch means and complete said signal circuit in response to an over-temperature condition, and in response to an under-pressure condition.

2. A pressure-biased, temperature sensor for a fluid system as claimed in claim 1, wherein said fluid at a reference pressure is air at atmospheric pressure.

3. A pressure-biased, temperature sensor for a fluid system as claimed in claim 1, wherein said first expandable bellows operator and second expandable bellows operator are metal.

4. A pressure-biased, temperature sensor for a fluid system as claimed in claim 1, wherein said signal means is a warning lamp.

5. A pressure-biased temperature sensor for a fluid system as claimed in claim 1, wherein said fluid system is an automobile coolant system.

* * * * *